United States Patent [19]

Onishi et al.

[11] Patent Number: 4,682,333
[45] Date of Patent: Jul. 21, 1987

[54] DECODER FOR DECODING A TWO-STAGE ENCODED CODE

[75] Inventors: Ken Onishi, Kyoto; Yasuo Sugiyama, Ibaragi, both of Japan

[73] Assignee: Mitsubishi Denki Kabushiki Kaisha, Tokyo, Japan

[21] Appl. No.: 748,402

[22] Filed: Jun. 24, 1985

[30] Foreign Application Priority Data

Jun. 28, 1984 [JP] Japan .................................. 59-135507

[51] Int. Cl.$^4$ ............................................. G06F 11/10
[52] U.S. Cl. .......................................... 371/39; 371/38
[58] Field of Search ......................... 371/37, 38, 39, 40

[56] References Cited

U.S. PATENT DOCUMENTS

| | | | |
|---|---|---|---|
| 4,398,292 | 8/1983 | Doi et al. | 371/39 |
| 4,498,175 | 2/1985 | Nagumo et al. | 371/37 |
| 4,532,629 | 7/1985 | Furuya et al. | 371/38 |
| 4,598,403 | 7/1986 | Odaka | 371/39 |
| 4,603,413 | 7/1986 | Sinjou et al. | 371/4 X |

*Primary Examiner*—Charles E. Atkinson
*Attorney, Agent, or Firm*—Birch, Stewart, Kolasch & Birch

[57] ABSTRACT

A decoder for decoding a code C which is two-stage encoded by a $C_1$ code ((N, K, D) Q dimensional code) and a $C_2$ code ((n, k, d) q dimensional code), which includes: a $C_1$ decoder including an error correction means for conducting an error correction of the errors below the number $[(D-1)/2]$ to output the decoded word, and a weight generator which generates wj (j=1, 2, ..., n) when i (i=0 to $[(D-1)/2]$) errors are corrected and an error detection (correction disability) is judged; a $C_2$ decoder for decoding the $C_2$ code including a forfeiture error correction means for judging the position j of the wj among the weight vector w in the received word r which is obtained in accordance with the decoded word output from the $C_1$ decoder, and conducting a forfeiture error decoding. A weighted distance calculating means for calculating the weighted distance $\rho^{(k)}$ between the decoded word $r^{(k)}$ and the received word r when a decoded word in each of K=0, 1, ..., $[(D-1)/2]$ is obtained; the $C_2$ decoder also including a comparator for comparing the weighted distance $\rho^{(k)}$ and the integer $\tau$, outputs the decoded word $r^{(k)}$ as a correct decoded word when the $\rho^{(k)}$ is smaller than or equal to $\tau$, and the correction disability signal when the $\rho^{(k)}$ is larger than $\tau$ or no decoded word is obtained by the forfeiture error correction means.

2 Claims, 6 Drawing Figures

DECODER FOR DECODING A TWO-STAGE ENCODED CODE

FIELD OF THE INVENTION

The present invention relates to a decoder for decoding a two-stage encoded code.

BACKGROUND OF THE INVENTION

A two-stage encoded code is widely used as an error correction code in such a CIRC error correction code in CD (Compact Disc) systems, and therefore, a decoder for decoding that code has been developed.

FIG. 1 shows a block diagram of an encoder for conducting a two-stage encoding. The reference numeral 1 designates an input terminal to which a signal to be encoded is input. The numeral 2 designates a $C_2$ encoder. The numeral 3 designates an interleaving circuit. The numeral 4 designates a $C_1$ encoder. The numeral 5 designates an output terminal from which the two-stage encoded code C is output.

In such an encoder, the $C_2$ code, which is obtained by an (n, k, d) q dimensional encoding, is subjected to an inter-exchange processing by the interleaving circuit 3. Hereupon, n is the code length, k is the information length, and d is the minimum distance of the code. Next, a two-stage encoded code C, which is obtained by further conducting (N, K, D) Q dimensional encoding by the $C_1$ encoder 4, is output from the output terminal 5. Hereupon, if the q is equal to $Q^K$, C is a concatenated code, if q is equal to Q, C is a product code, and if q is equal to the $Q^{k/l}$ (l is a measure of K) the code C is a code of Inoue, Sugiyama and Onishi (A NEW CLASS OF BURST-ERROR-CORRECTING CODES AND IT'S APPLICATION TO PCM TAPE RECORDING SYSTEMS, NTC 1978 Vol. 1, 2). A code which is not a block code, such as a cross-interleaving system two-stage encoded code, may be included in the above-described code C.

FIG. 2 shows a block diagram of a decoder for decoding the two-stage encoded code. The reference numeral 5 designates an input terminal to which a code to be decoded is input. The numeral 6 designates a $C_1$ decoder. The numeral 7 designates a de-interleaving circuit. The numeral 8 designates a $C_2$ decoder. The numeral 9 designates an output terminal for a decoded word. The numeral 10 designates an output terminal for a flag.

In such a decoder, the $C_1$ code is decoded by the $C_1$ decoder 6, and a flag is output in accordance with the state of the decoding. In the de-interleaving circuit 7, the $C_2$ code is restored to the state where the code is generated, and it is decoded by the $C_2$ decoder 8. When an error correction is possible this error correction is carried out to output a decoded word to the output terminal 9, and when the error correction is impossible a flag is output to the output terminal 10.

As a conventional decoding method, there is an error correction method shown in Japanese Laid-Open Patent Publication No. Sho. 58-29237. In this method, corrections of one-word errors and two word errors are conducted at the time of decoding of the $C_1$ code, and the fact that more than three words have errors is detected at the decoding of the $C_1$ code, and three pointers respectively indicating the correction of one-word errors, the correction of two-word errors and the detection of more than three-word errors are added, and thereafter, the decoding of the $C_2$ code is conducted. A flowchart thereof is shown in FIG. 3:

The number of the three kinds of pointers are designated by $N_1$, $N_2$, and $N_3$, and the decoding is conducted in accordance with the states of the error and the pointer. For example, if the $C_1$ code is set as the (32, 28, 5) RS (Reed Solomon) code on the Galois Field ($2^8$) and the $C_2$ code is set as the (28, 24, 5) RS code, pointers are added to the whole of the $C_2$ code when $N_3$ is smaller than or equal to $Z_5$, and when the obtained error location i is not the error location of the $C_2$ code in a case of one-word error as shown in the flowchart of FIG. 3. When $N_3$ is larger than $Z_5$, the pointer of the $C_1$ code is copied. When the error location i is the error location of the $C_2$ code, and when a pointer is located at i, one word is corrected when $N_3 \leq Z_2$, and a pointer is copied when $N_3 > Z_2$. When a pointer is not located at i, one word is corrected when $N_3 \leq Z_3$, a pointer is added to the whole of the $C_2$ code when $N_3 > Z_3$ and $N_3 > Z_4$, and a pointer is copied when $N_3 > Z_3$ and $N_3 > N_4$. Furthermore, although it is not shown in FIG. 3, $N_2$ may be considered in the judgment of $N_3 \leq Z_2$, and may be used in a smaller weight than $N_3$.

Under such a decoding method, however, the capability of correction of all the errors up to the number $[dD/2]$ against the combined distance $dD=25$ of the $C_1$ and $C_2$ codes is not assured. Furthermore, the capability of detection of all errors less than the number (dD−[dD/2]).

As other prior art, there is a text "Concatenated Codes" G. David Forney, Jr. The MIT PRESS.

SUMMARY OF THE INVENTION

The present invention is directed to solve the problems pointed out above, and has for its object to provide a decoder for decoding a two-stage encoded code capable of reproducing exactly the transmitted code from the received word at the two-stage decoding when the number of errors ν occurring in the n×n sections as the combined first stage $C_1$ code and second stage $C_2$ code is smaller than τ, and further capable of outputting an error detection signal without correcting errors when the number of errors ν is smaller than the numer (dD−τ).

Other objects and advantages of the present invention will become apparent from the detailed description given hereinafter; it should be understodd, however, that the detaled description and specific embodiment are given by way of illustration only, since various changes and modifications within the spirit and scope of the invention will become apparent to those skilled in the art from this detailed description.

According to the present invention, there is provided a decoder for decoding a code C which is two-stage encoded by a $C_1$ code ((N, K, D) Q dimensional code) and a $C_2$ code ((n, k, d) q dimensional code), which comprises:

a $C_1$ decoder including an error correction means for conducting an error correction of the errors below the number [(D−1)/2]([M]is the biggest integer which does not exceed M) to output the decoded word, and a weight generator which generates $w_j$ (j=1, 2, ..., n) given by the following equation (1) when i (i=0 to ([D−1]/2)) numbers of errors are corrected and an error detection (correction disability) is judged;

a $C_2$ decoder for decoding the $C_2$ code including a forfeiture/error correction means for judging the position j of the wj among the weight vector w in the received word ιr given by the equation (2) which is obtained in accordance with the decoded word output from the $C_1$ decoder which satisfies the inequality (2a), and conducting a forfeiture/error decoding which satisfies the inequality (2b);

a weighted distance calculating means for calculating the weighted distance $\rho^{(k)}$ between the decoded word $\hat{\iota r}^{(k)}$ and the received word ιr given by the equation (4) when a decoded word in each of K; 0, 1, ..., [(D−1)/2] is obtained; and a $C_2$ decoder, including a comparator for comparing the weighted distance $\rho^{(k)}$ and the integer $\tau$, which outputs the decoded word $\hat{\iota r}^{(k)}$ as a correct decoded word when the $\rho^{(k)}$ is smaller than or equal to $\tau$, and outputs a correction disability signal when the $\rho^{(k)}$ is larger than $\tau$ or no decoded word is obtained by the forfeiture/error correction means.

$$wj = \begin{bmatrix} i: \text{when the number of errors are corrected.} \\ D/2 \text{ or } [(D+1)/2] \\ \quad : \text{when an error detection is judged.} \end{bmatrix} \quad (1)$$

$$\iota r = (r_1, r_2, \ldots, r_n) \quad (2)$$

$$wj \geq D/2 - K(K = 0, 1, \ldots, [(D-1)/2]) \quad (2a)$$
$$n\epsilon^{(K)} + 2n e^{(K)} \leq 2\tau/D$$

($n\epsilon^{(K)}$: the number of forfeitures when $K$ is equal to 0, 1, ..., $[(D-1)/2]$, \quad (2b)

$n e^{(K)}$: the number of errors when $K$ is equal to 0, 1, ..., $[(D-1)/2]$, $\tau$: an integer which satisfies $0 \leq \tau < dD/2$)

$$\iota w = (w_1, w_2, \ldots, w_n) \quad (3)$$

$$\rho^{(K)} = \sum_{j=1}^{n} \delta_j \quad (4)$$

$$\delta_j = \begin{bmatrix} wj: \text{ when } j \text{ is not the position of the forfeiture, and } \hat{r}_j^{(K)} = rj. \\ D - Wj: \text{ when } j \text{ is not the position of the forfeiture, and } \hat{r}_j^{(K)} \neq rj. \\ D/2 \text{ or } [(D-1)/2] \\ \quad : \text{when } j \text{ is the position of the forfeiture.} \end{bmatrix}$$

DETAILED DESCRIPTION OF THE PREFERRED EMBODIMENTS

Figure 1:
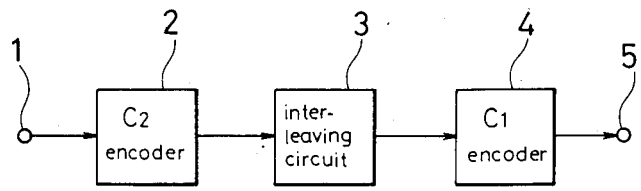
FIG. 1 shows a block diagram of an encoder for conducting a two-stage encoding.
Figure 2:
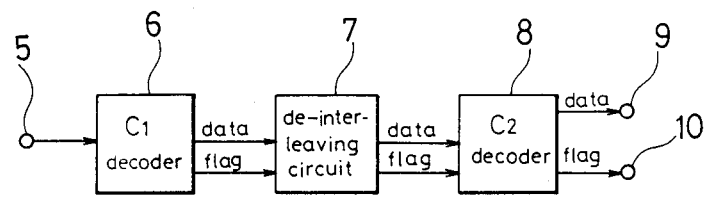
FIG. 2 shows a block diagram of a decoder for decoding a two-stage encoded code.
Figure 3:
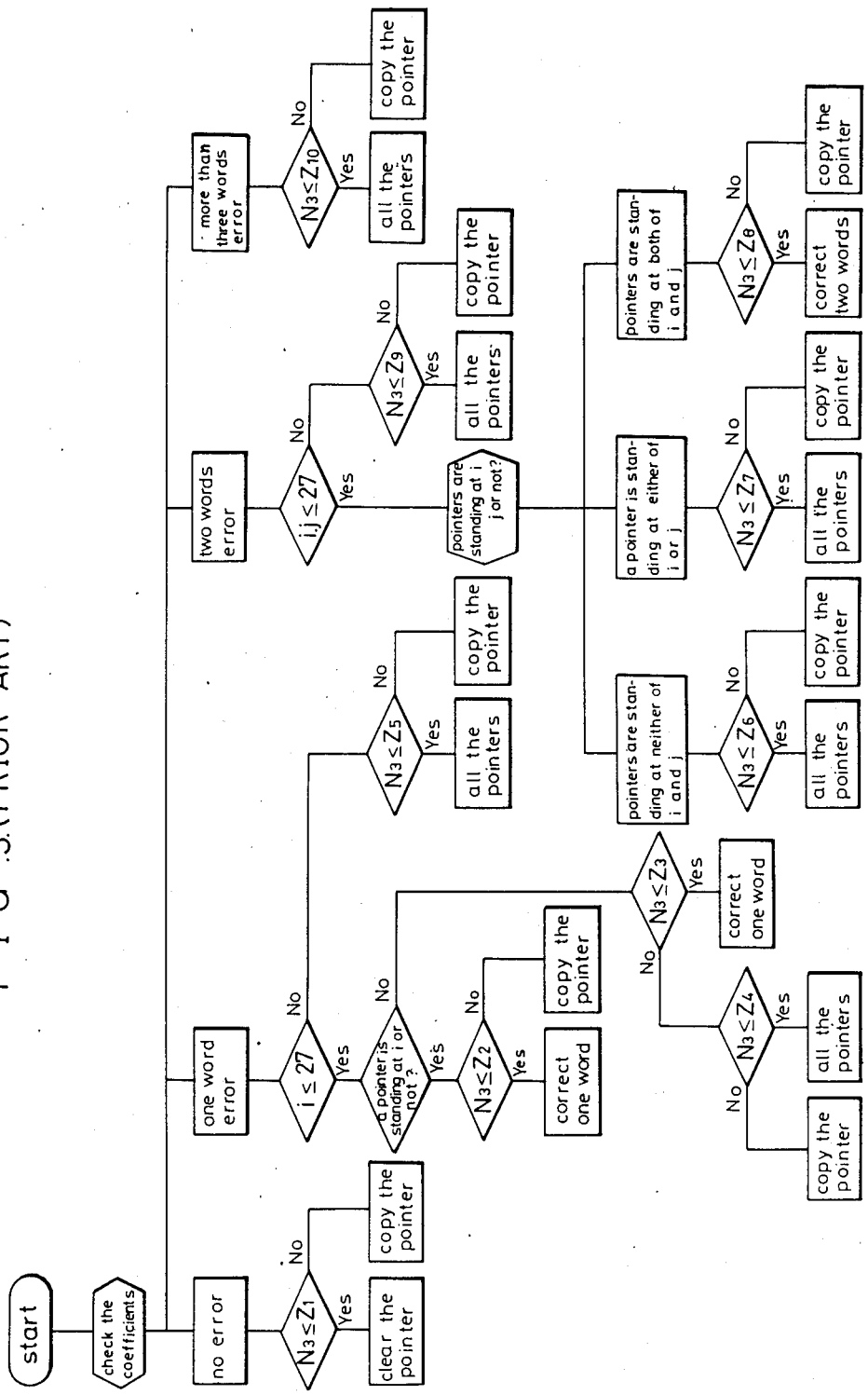
FIG. 3 is a flowchart showing the operation of the conventional $C_2$ decoder.

The decoding method used in the decoder of the present invention will be described, and thereafter one embodiment of the present invention will be described in the following with reference to FIGS. 4 to 6:

At first, the second stage code $C_2$ and the first stage code $C_1$ of the two-stage encoded code C are made (n, k, d) q dimensional code, and (N, K, D) Q dimensional code, respectively. Hereupon, if $q=Q^k$, the code C is a concatenated code, if $q=Q$ the code C is a product code, and if $q=Q^{k/l}$ (l is a measure of K), the code C is an Inoue, Sugiyama, and Onishi code. Furthermore, the decoding method described below can be used in a code C which is a non-block code, such as a cross-interleaving system two-stage encoded code.

The decoding of the first stage code $C_1$ is described as follows:

An error correction below the number [(D−1)/2] is conducted against the (N, K, D) Q dimensional code, and the j-th symbol rj ($\epsilon GF(q)$) of the second stage code $C_2$ is reproduced. When i errors are corrected, and an error detection (correction disability) is judged, a weight wj $$wj = \begin{bmatrix} i: \quad \text{when } i \text{ errors are corrected.} \\ D/2: \text{when an error detection is judged.} \end{bmatrix} \quad (5)$$

is established.

The decoding of the (n, k, d) q dimensional code as the second stage code is described:

The $C_2$ decoder for decoding the second stage code receives the received word ιr and the weight vector w from the $C_1$ decoder. Hereupon, $$\iota r = (r_1, r_2, \ldots, r_n) \quad (6)$$

$$w = (w_1, w_2, \ldots, w_n) \quad (7)$$

Where, rj is an element of GF(q), and wj takes a value given by the formula (5). Then, the decoding algorithm shown in the following is conducted.

DECODING ALGORITHM (Step 1)

The received word ιr, the weight vector w, and an integer $\tau (0 \leq \tau < dD/2)$ are given as follows:

$$\iota r = (r_1, r_2, \ldots, r_n) \quad (8)$$

$rj \epsilon GF(q)$ $$\iota w = (w_1, w_2, \ldots, w_n) \quad (9)$$

$wj \epsilon \{0, 1, 2, \ldots,$ $[(D-1)/2] - 1,$ $[(D-1)/2], D/2\}$ (Step 2)
The value K of the repetition number is set to 0.
(Step 3)
In the weight vector w, the position j of the received word which position satisfies $wj \geq D/2 - K$ is judged as forfeiture.
(Step 4)
The number of forfeitures in each of K=0, 1, ..., is designated by $n\epsilon^{(k)}$, and the number of errors is designated by $n\epsilon^{(k)}$ and a forfeiture error correction which satisfies the inequality:

$$n\epsilon^{(k)} + 2n e^{(k)} \leq 2\tau/D$$

is conducted.

(i) When a decoded word is obtained, the weighted distance $\rho^{(k)}$ between the decoded word $\hat{r}^{(k)}$ and the received word $\mathbf{r}$ is calculated.

$$\rho^{(K)} = \sum_{j=1}^{n} \delta j \tag{10}$$

$$\delta j = \begin{bmatrix} wj: & \text{when } j \text{ is not the position of forfeiture, and } \hat{r}_j^{(k)} = rj. \\ D - wj: & \text{when } j \text{ is not the position of forfeiture, and } \hat{r}_j^{(k)} \neq rj. \\ D/2: & \text{when } j \text{ is the position of forfeiture.} \end{bmatrix}$$

When the (i-a) weighted distance $\rho^{(k)}$ satisfies $$\rho^{(k)} \leq \tau \tag{11}$$

for an integer $\tau(0 \leq \tau < dD/2)$, this decoded word $\hat{r}^{(k)}$ is made a decoded word $r^{(k)}$ in this algorithm, and it is concluded.

When the (i-b) weighted distance $\rho^{(k)}$ satisfies $$\rho^{(k)} > \tau \tag{12}$$

the algorithm proceeds to the next step 5.

(ii) When the decoded word is not obtained, the algorithm proceeds to the next step 5.

(Step 5)

(i) When the value of the repetition number K satisfies $$K \geq [(D-1)/2], \tag{13}$$

the algorithm concludes as correction disability.

(ii) When the value of the repetition number K satisfies $$K < [(D-1)/2]. \tag{14}$$

the algorithm jumps to the step 3 after K+1 is set to K. (Conclusion of the decoding algorithm.)

In such a decoding algorithm, if the number of errors $\nu$ occurring in the $n \times N$ sections of the combined first stage code and second stage code is smaller than or equal to $\tau(0 \leq \tau < dD/2)$, this decoding algorithm reproduces exactly the transmitted code word from the received word $\mathbf{r}$. If the number of errors $\nu$ occurring in the $n \times N$ sections is smaller than $dD - \tau$, this decoding algorithm does not become an error correction.

This is verified as follows:

[Lemma 1]

Suppose that the number of errors occurring in the $n \times N$ sections is designated by $\nu$, when an equality $$\nu \leq \tau \tag{15}$$

is satisfied for a given integer $\tau(0 \leq \tau < dD/2)$, the following is established in the above decoding algorithm for the value of the repetition number K larger than or equal to 1.

$$\hat{r}^{(k)} = \mathbf{l}b \tag{16}$$

where $\mathbf{l}b$ is a transmitted code word.

[Verification]

Suppose that the number of positions j in which a correct correction is conducted and the weight thereof is i is designated by $n_C^{(i)}$, the number of the positions j in which an incorrect correction is conducted and the weight thereof i is designated by $n_E^{(i)}$, and the number of the positions j in which the error detection is judged, that is, the weight thereof D/2 is designated by $n_D$ in the received word $\mathbf{r}$ and the weighted vector $\mathbf{w}$. Hereupon, as described above $i = 0, 1, \ldots, [(D-1)/2]$. Then, there exists a following relation between the number of the errors $\nu$ occurred in the $n \times N$ sections and a given integer $\tau(0 \leq \tau < dD/2)$ $$\tau \geq \nu \geq \sum_{i=0}^{[(D-1)/2]} i n_C^{(i)} + \tag{17}$$

$$\sum_{i=0}^{[(D-1)/2]} (D-1) n_E^{(i)} + (D/2) n_D$$

In the repetition number K in the decoding algorithm, the number of forfeitures is equal to $$n_D + \sum_{i=[(D-1)/2]-K+1}^{[(D-1)/2]} (n_C^{(i)} + n_E^{(i)})$$

and the number of errors is equal to $$\sum_{i=1}^{[(D-1)/2]-K} n_E^{(i)}$$

Suppose that $$n_D + \sum_{i=[(D-1)/2]-K+1}^{[(D-1)/2]} (n_C^{(i)} + n_E^{(i)}) + \tag{18}$$

$$2 \sum_{i=0}^{[(D-1)/2]-K} n_E^{(i)} > \frac{2\tau}{D}$$

where $K = 0, 1, \ldots, [(D-1)/2]$ is established in all repetitions of the decoding algorithm. That is, suppose that an axact decoding is incapable in all the repetitions (Even in this condition, there is occasionally a case where an exact decoding is capable.) Then, the both sides of the inequality (18) are added for each of $K = 0, 1, 2, \ldots, [(D-1)/2]$, and both sides of the inequality (18) are multiplied by $D/2 - [(D-1)/2]$ for $K = 0$, and added together.

$$\sum_{K=1}^{[(D-1)/2]} n_D + \tag{19}$$

$$\sum_{K=1}^{[(D-1)/2]} \sum_{i=[(D-1)/2]-K+1}^{[(D-1)/2]} (n_C^{(i)} + n_E^{(i)}) +$$

$$2 \sum_{K=1}^{[(D-1)/2]} \sum_{i=0}^{[(D-1)/2]-K} n_E^{(i)} +$$

$$(D/2 - [(D-1)/2]) \left( n_D + 2 \sum_{i=0}^{[(D-1)/2]} n_E^{(i)} \right) >$$

$$\sum_{K=1}^{[(D-1)/2]} \frac{2\tau}{D} + (D/2 - [(D-1)/2]) \frac{2\tau}{D}$$

This inequality can be arranged as follows:

$$[(D-1)/2]n_D + \sum_{i=0}^{[(D-1)/2]} i(n_C^{(i)} + n_E^{(i)}) + \quad (20)$$

$$2\sum_{i=0}^{[(D-1)/2]} ([(D-1)/2 - i])n_E^{(i)} +$$

$$(D/2 - [(D-1)/2])\left(n_D + 2\sum_{i=0}^{[(D-1)/2]} n_E^{(i)}\right) > \tau$$

This inequality can be further arranged as follows:

$$(D/2) n_D + \sum_{i=0}^{[(D-1)/2]} i n_C^{(i)} + \quad (21)$$

$$\sum_{i=0}^{[(D-1)/2]} (D-i) n_E^{(i)} > \tau$$

The comparison of this inequality (21) and the inequality (17) apparently shows a conflict.

Accordingly, at least one among the repetitions of the decoding algorithm must be an exact decoding which results in the following relation: $\hat{r}^{(k)} = b$.

[Lemma 2]

When the number of errors occurring in the n×N section is designated by $\nu$, the weighted distance between the transmitted code word $lb$ and the received word $lr$ satisfies $$\rho r, lb \leq \nu \quad (22)$$

[Verification]

Suppose that the number of the positions j in which an exact correction is conducted and the weight thereof i is designated by $n_C^{(i)}$, the number of the positions j in which an incorrect correction is conducted and the weight thereof i is designated by $n_E^{(i)}$, and the number of the positions j in which an error detection is judged, that is, the weight thereof D/2 is designated by $n_D$ in the received word $lr$ and the weight vector $w$. Hereupon, as described above $i = 0, 1, \ldots, [(D-1)2]$. Then there is established the following relation including the number of errors $\nu$ occurring in the n×N sections at one side.

$$\nu \geq \sum_{i=0}^{[(D-1)/2]} i n_C^{(i)} + \quad (23)$$

$$\sum_{i=0}^{[(D-1)/2]} (D-i) n_E^{(i)} + (D/2) n_D$$

The right side of this inequality is the weighted distance $\rho r, lb$ itself between the transmitted code word $lb$ and the received word $lr$. Therefore, $$\nu \geq \rho r, lb \quad (24)$$

is established.

[Lemma 3]

When two different code words $\mathbb{C}, \mathbb{C}'$ are given, the weighted distance $\rho r, \mathbb{C}$ between the code word C and the received word $lr$ and the weighted distance $\rho r, \mathbb{C}'$ between the code word $\mathbb{C}'$ and the received word $lr$ satisfies the following inequality:

$$\rho r, \mathbb{C} + \rho r, \mathbb{C}' \geq dD \quad (25)$$

[Verification]

Suppose that the received word r and the weighted vector W are given, and then two different codes $\mathbb{C}, \mathbb{C}'$, the weighted distance $\rho r, \mathbb{C}$ between the code word $\mathbb{C}$ and the received word r and the weighted distance $\rho r, \mathbb{C}'$ between the code word $\mathbb{C}'$ and the received word $lr$ are taken into consideration.

Define the following group of positions by classifying the positions j.

$$\left.\begin{array}{l}J_1 = \{j | cj = cj'\} \\ J_2 = \{j | rj = cj \neq cj'\} \\ J_3 = \{j | rj = cj' \neq cj\} \\ J_4 = \{j | rj \neq cj \neq cj' \neq rj\}\end{array}\right] \quad (26)$$

Then, $$\rho|r, \mathbb{C} = \sum_{j \in J_1} \delta j + \sum_{j \in J_2} \delta j + \sum_{j \in J_3} \delta j + \sum_{j \in J_4} \delta j \quad (27)$$

$$\rho|r, \mathbb{C}' = \sum_{j \in J_1} \delta j' + \sum_{j \in J_2} \delta j' + \sum_{j \in J_3} \delta j' + \sum_{j \in J_4} \delta j \quad (28)$$

Accordingly, $$\rho|r, \mathbb{C} = \sum_{j \in J_1} \delta j + \sum_{j \in J_2} wj + \sum_{j \in J_3} (D - wj) + \sum_{j \in J_4} (D - wj) \quad (29)$$

$$\rho|r, \mathbb{C}' = \sum_{j \in J_1} \delta j + \sum_{j \in J_2} (D - wj) + \sum_{j \in J_3} wj + \sum_{j \in J_4} (D - wj) \quad (30)$$

Then, $$\rho|r, \mathbb{C} + \rho|r, \mathbb{C}' = 2\sum_{j \in J_1} \delta j + \sum_{j \in J_2} D + \sum_{j \in J_3} D + 2\sum_{j \in J_4} (D - wj) \quad (31)$$

Hereupon, $$\delta j \geq 0 \quad (32)$$

$$D - wj \geq D/2 \quad (33)$$

and as the distance between the code word $\mathbb{C}$ and the code word $\mathbb{C}'$ is at least larger than d, the number of j which belong to J2, J3, J4 must be equal to or larger than d. Accordingly, $$\rho r, \mathbb{C} + \rho r, \mathbb{C}' \geq dD \quad (34)$$

[Lemma 4]

For a given integer $\tau(0 \leq \tau < dD/2)$ only one code word whose weighted distance $\rho r, \mathbb{C}$ with the received word $lr$ satisfies the following inequality exists at most.

$$\rho r, \mathbb{C} \leq \tau \quad (35)$$

[Verification]

Suppose that the following inequalities $$\rho r, \mathbb{C} \leq \tau \quad (36)$$

$$\rho r, \mathbb{C}' \leq \tau \quad (37)$$

are satisfied for two different code words $\mathbb{C}, \mathbb{C}'$, then $$\rho r, \mathbb{C} + \rho r, \mathbb{C}' \leq 2\tau < dD \quad (38)$$

and this conflicts with the Lemma 3. Accordingly, only one code word which satisfies $$\rho r, \mathbb{C} \leq \tau \quad (39)$$

exists at most.

[Theorem]

When the number of errors $\nu$ occurring in the $n \times N$ sections is smaller than or equal to $\tau(0 \leq \tau < dD/2)$, the decoding algorithm reproduces exactly the transmitted code word from the received word $\mathbb{r}$. When the number of errors $\nu$ occurring in the $n \times N$ sections is smaller than dD-$\tau$, there does not arise an error correction.

[Verification]

When the number of errors $\nu$ occurring in the $n \times N$ sections is smaller than or equal to $\tau(0 \leq \tau < dD/2)$, the decoded word $\mathbb{r}^{(k)}$ becomes a transmitted code word $\mathbb{b}$ in at least one K of the repetitions from Lemma 1. The weighted distance $\rho\mathbb{r}, \mathbb{b}$ between the transmitted code word $\mathbb{b}$ and the received word $\mathbb{r}$ satisfies $$\rho\mathbb{r}, \mathbb{b} \leq \nu \leq \tau \quad (40)$$

from Lemma 2, and the judgment condition of the decoding algorithm $$\rho\mathbb{r}, \hat{\mathbb{r}}^{(k)} \leq \tau \quad (41)$$

is satisfied when $\mathbb{r}^{(k)} = \mathbb{b}$. Furthermore, the code word $\mathbb{C}$ which satisfies the judgment condition does not exist except for $\mathbb{b}$ because the code word $\mathbb{C}$ which satisfies $$\rho\mathbb{r}, \mathbb{c} \leq \tau \quad (42)$$

is unique from Lemma 4. Accordingly, the decoded word $\hat{\mathbb{r}}$ obtained from the decoding algorithm becomes the transmitted code word $\mathbb{b}$.

In the next place, the case where the number of errors $\nu$ occurring in the $n \times N$ sections satisfies $$\nu < dD - \tau \text{ is considered.} \quad (43)$$

Then, the weighted distance $\rho\mathbb{r}, \mathbb{b}$ between the transmitted code word $\mathbb{b}$ and the received word $\mathbb{r}$ satisfies $$\rho\mathbb{r}, \mathbb{b} \leq \nu < dD - \tau \quad (44)$$

Herein, suppose that an incorrect correction is conducted. That is, the weighted distance $\rho\mathbb{r}, \mathbb{C}''$ between the code word $\mathbb{C}''$ different from the transmitted code word $\mathbb{b}$ and the received word $\mathbb{r}$ satisfies $$\rho\mathbb{r}, \mathbb{c}'' \leq \tau \quad (45)$$

then the summation of the inequalities (44) and (45) becomes $$\rho\mathbb{r}, \mathbb{b} + \rho\mathbb{r}, \mathbb{C}'' \leq dD$$

However, in Lemma 3, the weighted distances $\rho\mathbb{r}, \mathbb{C}, \rho\mathbb{r}, \mathbb{C}'$, between the two different code words $\mathbb{C}, \mathbb{C}'$ and the received word $\mathbb{r}$ satisfies $$\rho\mathbb{r}, \mathbb{c} + \rho\mathbb{r}, \mathbb{c}' \geq dD \quad (46)$$

and this conflicts with the above inequality. Accordingly, an incorrect correction does not occur.

Figure 4:
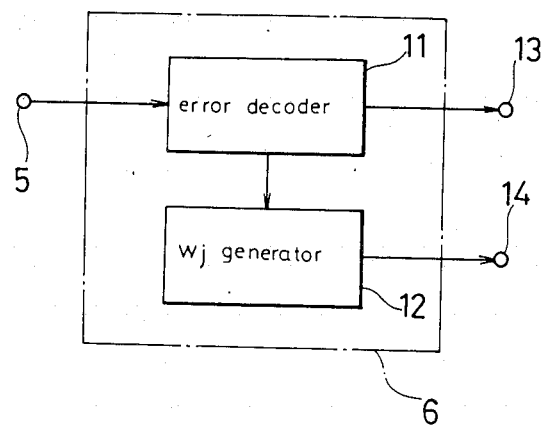
FIG. 4 is a block diagram showing an embodiment of the present invention.

The present invention provides a decoder for decoding a two-stage encoded code by the above-described decoding algorithm. One embodiment of the present invention will be described with reference to FIGS. 4 and 5:

In FIG. 4, the reference numeral 11 designates an error decoder (error correcting means) intended to conduct an error correction of errors below the number [(D-1)/2]against the $C_1$ code. The numeral 12 designates a weight generator intended to generate a weight signal in accordance with the decoding state of the error decoder 11. The numeral 13 designates an output terminal for a decoded word. The numeral 14 designates an output terminal for a weight signal.

Figure 5:
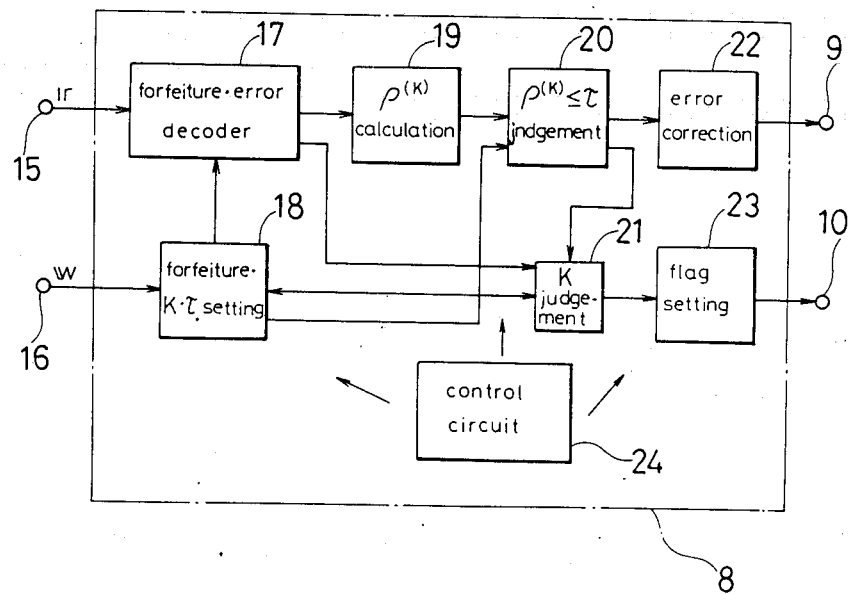
FIG. 5 is a block diagram showing the $C_2$ decoder of the embodiment of the present invention.

In FIG. 5, the numeral 15 designates an input terminal for the received word r. The numeral 16 designates an input terminal for the weight signal w. The numeral 17 designates a forfeiture error decoder intended to obtain the position and the size of the forfeiture and the error. The numeral 18 designates a forfeiture K.$\tau$. setting circuit for setting the position of forfeiture of the received word, a predetermined integer $\tau(0 \leq \tau < dD/2)$, and the value K of the repetition number. The forfeiture error decoder 17 and the forfeiture K.$\tau$. setting circuit 18 constitutes a forfeiture error correcting means for conducting a predetermined forfeiture error decoding (in this case, the obtaining of the values of the position and the size). The numeral 19 designates a weighted distance calculating circuit for calculating the weighted distance $\rho^{(k)}$ between the output of the forfeiture error decoder and the received word. The numeral 20 designates a weighted distance judging circuit (comparator means) for judging $\rho^{(k)} \leq \tau$ or not by comparing the weighted distance $\rho^{(k)}$ and the integer $\tau$ set by the forfeiture .K.$\tau$ setting circuit 18. The numeral 21 designates a K judging circuit for judging whether $K \geq [(D-1)/2]$ or not, where K is a value of the repetition number. The numeral 22 designates an error correction circuit for conducting an error correction. The numeral 23 designates a flag setting circuit. The numeral 24 designates a control circuit for supplying required clocks to each component.

The device operates as follows:

As an example, the case is considered where the $C_1$ code is (32, 28, 5) RS code on GF ($2^8$), and the $C_2$ code is (28, 24, 5) RS code on GF($2^8$).

In the $C_1$ decoder 6 an error correction of errors below the number $[(D-1)/2]=[(5-1)/2]=2$ is conducted by the error decoder 11, and the decoded word is output to the output terminal 13. Then a weight wj is generated by the weight generator 12 in accordance with the decoded result, and the weight wj is output to the output terminal 14 for each decoded word. In this case, the valve of weight wj is represented by the following from the formula (5).

$$wj = \begin{bmatrix} 0: \text{when no error is detected.} \\ 1: \text{when one error is corrected.} \\ 2: \text{when two errors are corrected.} \\ 2.5: \text{when an error detection is judged.} \end{bmatrix} \quad (47)$$

In this way the weight has 4 possible values, and is represented by 2 bits.

Figure 6:
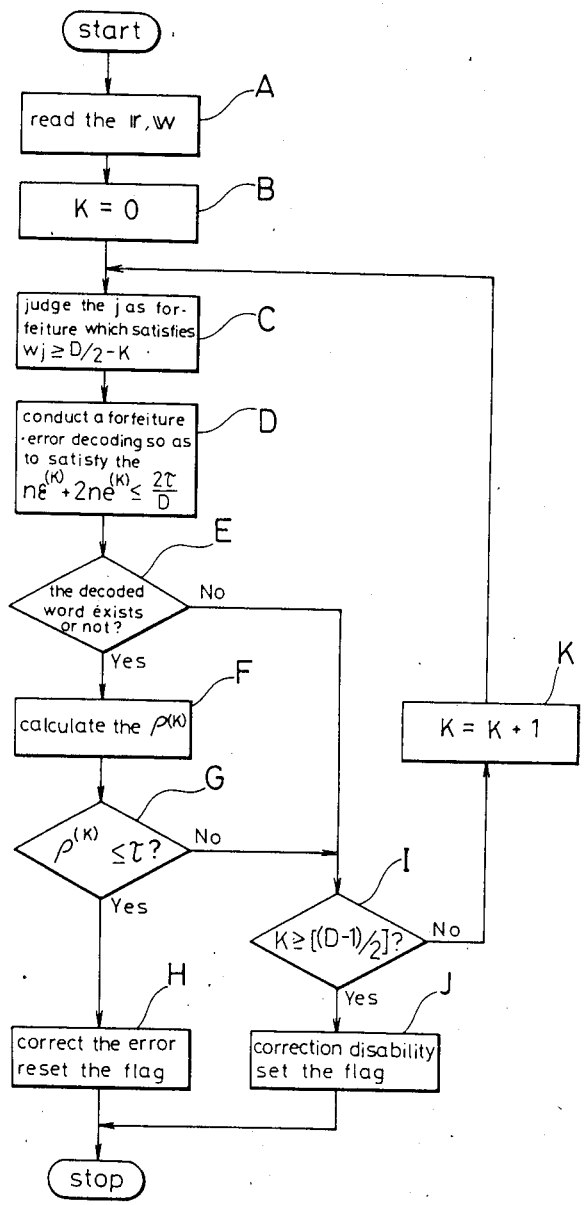
FIG. 6 is a flowchart showing the operation of the $C_2$ decoder of the embodiment of the present invention.

The operation of the $C_2$ decoder 8 is described with reference to FIGS. 5 and 6:

FIG. 6 is a flowchart of the decoding of the $C_2$ code:

The received word $\mathbb{r}$ and the weight vector w are input from the input terminals 15 and 16, respectively (Step A). As the dD/2=12.5 in this case, $\tau$ is set to 12 by the forfeiture .K.$\tau$ setting circuit 18. Then, K is set to 0 (Step B), and the position j which satisfies $$wj \geq (D/2) - K, \text{ that is,}$$

$$wj \geq (5/2) - 0 = 2.5$$

in the weight vector $\mathbf{w}$ is set as a forfeiture (Step C), and a forfeiture error correction is conducted by the forfeiture error decoder 17 (Step D). As $\tau=12$, and $D=5$, the position and the size of the forfeiture and the error can be obtained which satisfies $$n\epsilon^{(k)} + 2 \cdot ne^{(k)} \leq 2\tau/D = 4.8$$

where $n\epsilon^{(k)}$ is the number of forfeitures, and $ne^{(k)}$ is the number of errors. When the decoded word is otained by the forfeiture error decoder 17, the weighted distance $\rho^{(k)}$ is calculated by the weighted distance calculating circuit 19 in accordance with the equation 10 (Step E, F). When it is judged by the weighted distance judging circuit 20 that $$\rho^{(k)} \leq \tau = 12$$

is satisfied, the $n\epsilon^{(k)}$ forfeitures and $ne^{(k)}$ errors the word is corrected, and are output to the output terminal 9 (Step G, H). At the same time, a flag is reset by a flag setting circuit 23, and is output to the output terminal 10 (Step H). Herein, the flag is set when the correction is incapable of being performed and is reset when no error is detected or all errors are corrected.

On the other hand, when the decoded word is not obtained by the forfeiture error decoder 17 or $\rho^{(k)} > \tau$, $K+1$ is set to K so as to set the forfeiture again, and the decoding is repeated if K satisfies the inequality (14) in the K judging circuit 21, that is, when $K < [(D-1)/2] = 2$ (Step E, G, I, K). If K satisfies the inequality (13), a flag is set as correction disability by the flag setting circuit 23, and is output to the output terminal 10 (Step I, J). Accordingly, in this example, K is set to values 0, 1, 2, and the forfeiture error decoder 17 conducts the decoding at most 3 times.

As evident from the foregoing, a weight is generated in accordance with the decoding state at the $C_1$ decoding, a weighted distance is calculated on the basis of the weight, and this distance is compared with a predetermined integer $\tau(0 \leq \tau < dD/2)$ to output a decoded signal, thereby resulting in an exact correction of errors below the number $\tau$, and an exact detection of all errors less than the number $dD - \tau$. This is quite clear from the above-described Theorem and its Verification. Futhermore, the value of can be changed easily, thereby enabling the adjustment of probability of error correction and that of error detection, thereby resulting in optimum decoding characteristics in accordance with the situation.

In the above illustrated embodiment the weight wj is set to D/2 when an error detection is judged in the inequality (5), but it is easily assured that the decoding algorithm is also established even when the weight wj is set to $[(D+1)/2]$. In this case, the $\delta j$ at the position of forfeiture in the inequality (10) may be set to $[(D+1)/2]$.

In the illustrated embodiment the position and the size of the forfeiture and the error are obtained by the forfeiture error decoder, and its correction is conducted by an error correction circuit, but the forfeiture error decoder may obtain the position and the size of the forfeiture and the error as well as conduct a correction at the same time.

What is claimed is:

1. A decoder for decoding a code C which is two-stage encoded by a $C_1$ code ((N, K, D) Q dimensional code) and a $C_2$ code ((n, k, d) q dimensional code), comprising:

a $C_1$ decoder including;
    error correction means for conducting an error correction of errors below the number $[(D-1)/2]$ ([M] is the biggest integer which does not exceed M) to output a decoded word at a first output terminal, and
    a weight generator which generates a weight signal wj (j=1, 2, ..., n) at a second output terminal when i (i=0 to $[(D-1)/2]$) errors are corrected and an error detection (correction disability) is judged;

a $C_2$ decoder for decoding the $C_2$ code including,
    forfeiture/error correction means having input terminals connected to said first and second output terminals for judging the position j of the weight signal wj among a weight vector $\mathbf{w}$ in a received word $\mathbf{r}$ which is otained in accordance with the decoded word output from the $C_1$ decoder which satisfies the inequality $wj \geq D/2 - K$ (K=0, 1, ... $[(D-1)/2]$), and conducting a forfeiture error decoding which satisfies the inequality $$n\epsilon^{(k)} + 2ne^{(k)} \leq 2\tau/D$$

$n\epsilon^{(k)}$ = the number of forfeitures when k=0, 1, ..., (D-1)/2, $ne^{(k)}$ = the number of errors when k=0, 1, ..., (D-1)/2, $0 \leq \tau < dD/2$,
    weighted distance calculating means for calculating a weighted distance $\rho^{(k)}$ between a decoded word $\hat{r}^{(k)}$ and the received word $\mathbf{r}$ when a decoded word in each of K=0, 1, ..., $[(D-1)/2]$ is obtained,
    comparator means for comparing the weighted distance $\rho^{(k)}$ and an integer $\tau$,
    means for outputting the decoded word $\hat{r}^{(k)}$ as a correct decoded word when $\rho^{(k)}$ is smaller than or equal to $\tau$, and
    means for outputting a correction disability signal when $\rho^{(k)}$ is larger than $\tau$ or no decoded word is obtained by the forfeiture error correction means, wherein $$wj = \begin{cases} i & \text{when } i \text{ errors are corrected} \\ D/2 \text{ or } (D+1)/2 & \text{when an error detection is judged} \end{cases}$$

$$\mathbf{r} = (r_1, r_2, \ldots, r_n)$$

$$\mathbf{w} = (w_1, w_2, \ldots, w_n)$$

$$\rho^{(k)} = \sum_{j=1}^{n} \delta j$$

$$\delta j = \begin{cases} wj & \text{when } j \text{ is not a forfeiture position and } \hat{r}^{(k)}_j = r_j \\ D - wj & \text{when } j \text{ is not a forfeiture position and } \hat{r}^{(k)}_j \neq r_j \\ D/2 \text{ or } (D-1)/2 & \text{when } j \text{ is a forfeiture position.} \end{cases}$$

2. A method for decoding a two-stage encoded code C from an information source, the code C having a first stage (N,K,D) Q dimensional code $C_1$ and a second stage (n,k,d) q dimensional code $C_2$, comprising the steps of:

(a) receiving said two-stage code from said source;

(b) correcting errors in said first stage code of a number less than or equal to $[(D-1)/2]$;
(c) producing a jth symbol $r_j$ of said second stage code;
(d) producing a weight signal $W_j$ corresponding to the weight or $r_j$, $W_j=i$ when i errors have been corrected ($O \leq i \leq [(D-1)/2]$), $W_j=D/2$ when an error has been detected but is incapable of being corrected;
(e) producing a received word vector $\mathbf{r}$ and a weight vector $\mathbf{w}$ composed of said symbols $r_j$ and weight signals $W_j$;
(f) setting a repetition cycle number K to O;
(g) determining as a forfeiture the component of r with a weight $W_j \geq D/2 - K$;
(h) conducting a forfeiture/error correction which satisfies the inequality $n\epsilon^{(k)} + 2ne^{(k)} \leq 2\tau/D$, where $n\epsilon^{(k)}$ = the number of forfeitures for K=0, 1 ..., $(D-1)/2$, $ne^{(k)}$ = the number of errors for K=0,1. ..., $(D-1)/2$, $O \leq \tau < dD/2$ to obtain a decoded word $\hat{r}^{(k)}$;
(i) calculating a weighted distance $\rho(k)$ between said decoded word and said received word component where $$\rho^{(K)} = \sum_{j=1}^{n} \delta_j, \ \delta_j = \begin{cases} w_j \text{ when } j \text{ is not a forfeiture position and } \hat{r}_j^{(k)} = r_j \\ D - w_j \text{ when } j \text{ is not a forfeiture position and } \hat{r}_j^{(k)} \neq r_j \\ D/2 \text{ when } j \text{ is a forfeiture position} \end{cases}$$

(j) outputting said decoded word when $\rho^{(k)} \leq \tau$;
(k) outputting a correction disability signal when $\rho^{(k)} > \tau$;
(l) terminating said method if $k \geq (D-1)/2$;
(m) incrementing K by 1 if $K < (D-1)/2$; and
(n) repeating steps (g) through (m) until step (k) is satisfied.

* * * * *